(12) United States Patent
Liu et al.

(10) Patent No.: US 10,592,616 B2
(45) Date of Patent: Mar. 17, 2020

(54) GENERATING SIMULATION DATA USING A LINEAR CURVE SIMPLIFICATION AND REVERSE SIMPLIFICATION METHOD

(71) Applicant: Quest Software Inc., Aliso Viejo, CA (US)

(72) Inventors: Shengzhi Liu, GuangDong (CN); Peisen Lin, GuangDong (CN); Yinghua Qin, GuangDong (CN)

(73) Assignee: Quest Software Inc., Aliso Viejo, CA (US)

(*) Notice: Subject to any disclaimer, the term of this patent is extended or adjusted under 35 U.S.C. 154(b) by 799 days.

(21) Appl. No.: 15/055,901

(22) Filed: Feb. 29, 2016

(65) Prior Publication Data

US 2017/0249402 A1    Aug. 31, 2017

(51) Int. Cl.
*G06F 17/50* (2006.01)
*G06N 5/02* (2006.01)

(52) U.S. Cl.
CPC ......... *G06F 17/5009* (2013.01); *G06N 5/02* (2013.01)

(58) Field of Classification Search
None
See application file for complete search history.

(56) References Cited

U.S. PATENT DOCUMENTS

2015/0324326 A1* 11/2015 Chen ................. G06F 17/18
702/179

OTHER PUBLICATIONS

Brodsky et al. "R-Simp: Model Simplification In Reverse, A Vector Quantization Approach", Mar. 2003, 9 pages. (Year: 2003).*

* cited by examiner

*Primary Examiner* — Suzanne Lo
(74) *Attorney, Agent, or Firm* — Kirton McConkie; Brian Tucker (57) ABSTRACT

Simulation data can be generated using a linear curve simplification and reverse simplification technique. The linear curve simplification and reverse simplification technique can facilitate the generation of simulation data from existing data where the simulation data will exhibit the same curve pattern as the existing data but with a degree of variation. In this way, varying sets of simulation data for a particular environment can be easily generated.

20 Claims, 13 Drawing Sheets

GENERATING SIMULATION DATA USING A LINEAR CURVE SIMPLIFICATION AND REVERSE SIMPLIFICATION METHOD

CROSS-REFERENCE TO RELATED APPLICATIONS

N/A

BACKGROUND

Data simulation is widely used in system performance testing, load testing, and demo environment setup. In this context, simulated data represents resource utilization over time in the environment being tested. For example, simulated data can represent a typical CPU load, memory utilization, I/O operations, network utilization, response time, etc. For simulated data to be useful, it should approximate actual data. In other words, the simulated data should represent resource utilization that the environment may actually experience during typical operation.

BRIEF SUMMARY

The present invention extends to methods, systems, and computer program products for generating simulation data using a linear curve simplification and reverse simplification method. This method can facilitate the generation of simulation data from existing data where the simulation data will exhibit the same curve pattern as the existing data but with a degree of variation. In this way, varying sets of simulation data for a particular environment can be easily generated.

In one embodiment, the present invention can be implemented as a method, performed by a reverse simplification engine, for generating simulation data based on existing data. Characteristic points that were generated from the existing data using a simplification algorithm can be received. The existing data can comprise a series of points. A parameter that was employed by the simplification algorithm to identify which of the points of the existing data would be characteristic points can also be received. For each adjacent pair of characteristic points, a reverse simplification data sample zone can be defined. For each defined reverse simplification data sample zone, a number of additional points that fall within the reverse simplification data sample zone can be generated. The number of additional points generated for each defined reverse simplification data sample zone along with the characteristic points can then be output as a new set of simulation data.

In another embodiment, the present invention can be implemented as a computing system for generating simulation data from existing data, the system can include: a simplification engine that is configured to receive the existing data and a compression rate and to generate a number of characteristic points from the existing data employing a parameter that causes the number of characteristic points to match the compression rate; and a reverse simplification engine that is configured to receive the characteristic points and the parameter from the simplification engine. The reverse simplification engine can be further configured to employ the parameter in a reverse simplification algorithm to generate a new set of simulation data from the characteristic points. The new set of simulation data can include the characteristic points and a number of additional points generated for each adjacent pair of characteristic points.

In another embodiment, the present invention can be implemented as one or more computer storage media storing computer executable instructions which when executed by one or more processors implement a method for generating new data based on existing data. The method can include receiving characteristic points that were generated from the existing data using a simplification algorithm, the existing data comprising a series of points, and receiving a parameter that was employed by the simplification algorithm to identify which of the points of the existing data would be characteristic points. For each adjacent pair of characteristic points, the method can include: identifying a first line between a first and a last characteristic point; identifying a second line that is parallel to the first line and is the farthest-spaced line from the first line that intersects a characteristic point; identifying a first rectangle that has a first set of opposing sides that extend along the first and second lines and a second set of opposing sides that intersect the adjacent pair of characteristic points; identifying a second rectangle that has a first set of opposing sides that intersect the adjacent pair of characteristic points, has an axis of symmetry along a line segment between the adjacent pair of characteristic points, and that has a second set of opposing sides that are each spaced from the axis of symmetry by a value of the parameter; and generating a number of additional points within a reverse simplification data sample zone that comprises the intersection of the first and second rectangles. Finally, the method can include outputting the number of additional points generated for each adjacent pair of characteristic points along with the characteristic points as the new data.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
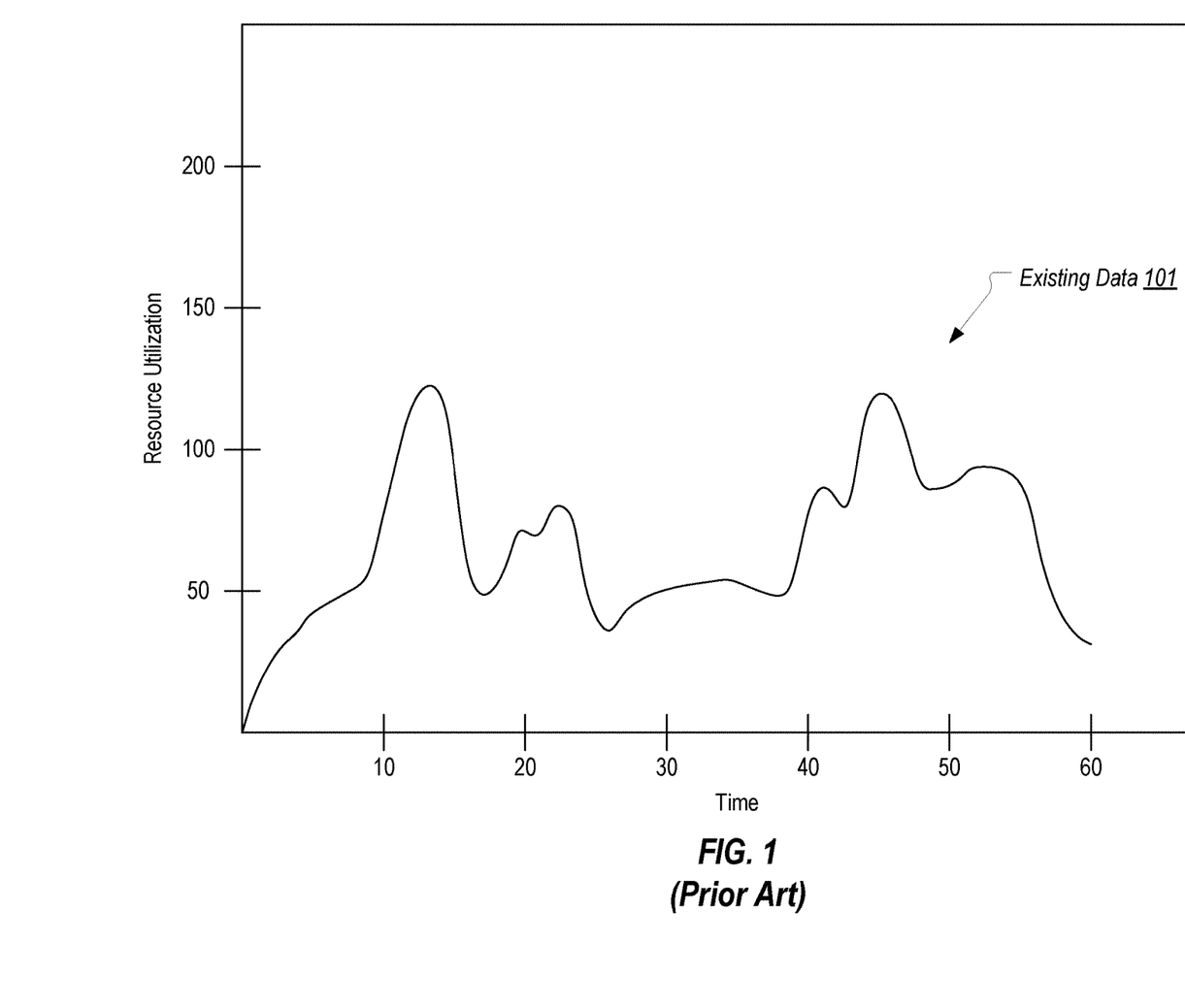
FIG. 1 illustrates an example of existing data that comprises a series of points that define a linear curve.

FIG. 1 illustrates an example set of existing data 101. Existing data 101 comprises an ordered set of points where each point represents resource utilization at a particular time. Existing data 101 may encompass any number of points including hundreds, thousands, millions, etc. Resource utilization should be construed broadly to encompass any metric of a computing system that can be monitored and quantified. In some embodiments, existing data 101 can represent actual resource utilization obtained by monitoring a system's performance over time, whereas in other embodiments, existing data 101 could represent previously generated simulation data. In any case, as a first step of generating simulation data, an existing set of data can be obtained.

Next, a simplification algorithm can be employed to convert existing data 101 into a reduced set of characteristic points. A number of known simplification algorithms can be employed to generate characteristic points including, for example, the Ramer-Douglas-Peucker algorithm, the Opheim simplification algorithm, or the Lang simplification algorithm. This specification will employ the Ramer-Douglas-Peucker algorithm as an example.

Figure 1A:
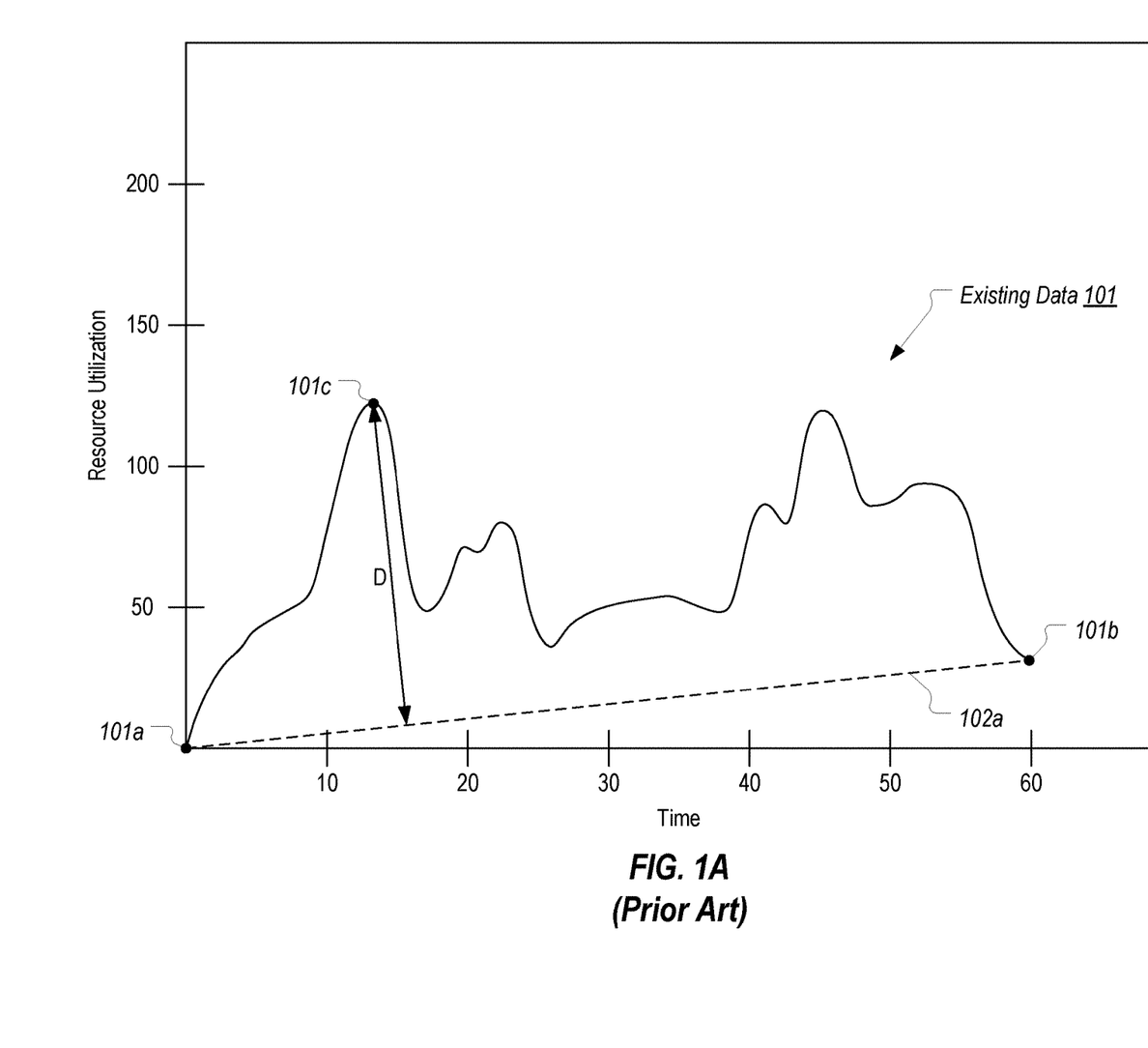
FIGS. 1A-1D illustrate how the Ramer-Douglas-Peucker algorithm can be applied to the existing data of FIG. 1 to produce characteristic points.
Figure 1B:
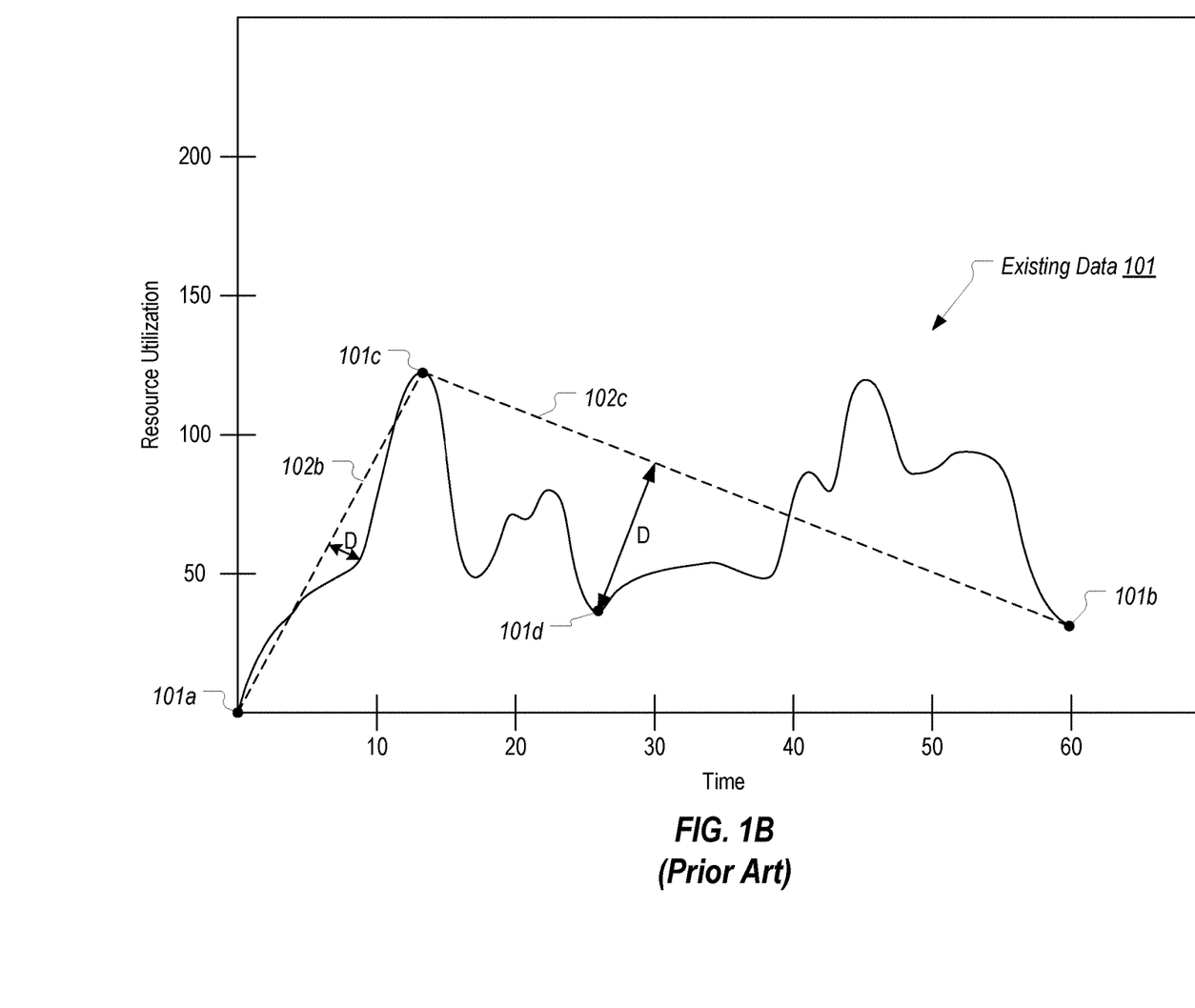
Figure 1C:
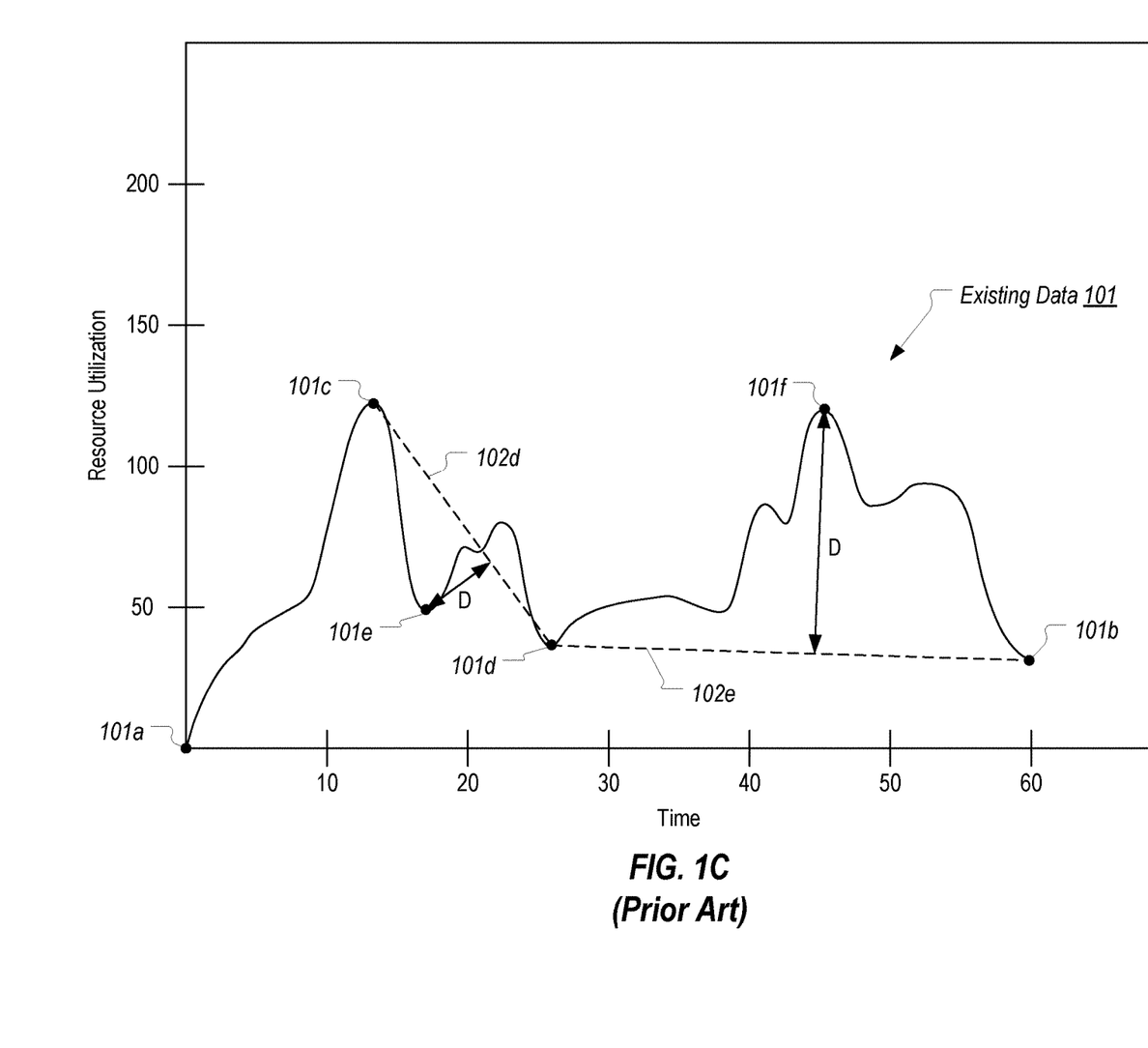

As an overview and as is known by those skilled in the art, the Ramer-Douglas-Peucker algorithm employs a distance parameter which is commonly represented using the Greek letter epsilon, $\varepsilon$. The value of $\varepsilon$ generally determines how many characteristic points will be generated for a particular dataset. FIGS. 1A-1C illustrate how the Ramer-Douglas-Peucker algorithm employs the value of $\varepsilon$ to determine whether a particular point in the existing data should be maintained as a characteristic point.

As represented in FIG. 1A, the first point 101a and the second point 101b of existing data 101 will always be maintained as characteristic points. A line segment 102a is then defined between these points and the remaining point of existing data 101 that is farthest from line segment 102a is identified. The perpendicular distance, D, between the identified point and line segment 102a is determined and compared to the value of $\varepsilon$. If D is greater than $\varepsilon$, the identified point is retained as a characteristic point. Accordingly, FIG. 1A shows that characteristic point 101c is retained.

This same process is recursively repeated by generating a line segment 102b between characteristic points 101a and 101c and a line segment 102c between characteristic points 101c and 101b as shown in FIG. 1B. The farthest remaining points from line segments 102b and 102c are identified and their distance compared to $\varepsilon$. In FIG. 1B, it is assumed that the identified point that is farthest from line segment 102b has a distance that is less than $\varepsilon$. Therefore, this point is not retained as a characteristic point and the recursive process is completed for all remaining points between points 101a and 101c. In contrast, the identified point that is farthest from line segment 102c has a distance that is greater than $\varepsilon$. Therefore, this point is retained as characteristic point 101d.

Figure 1D:
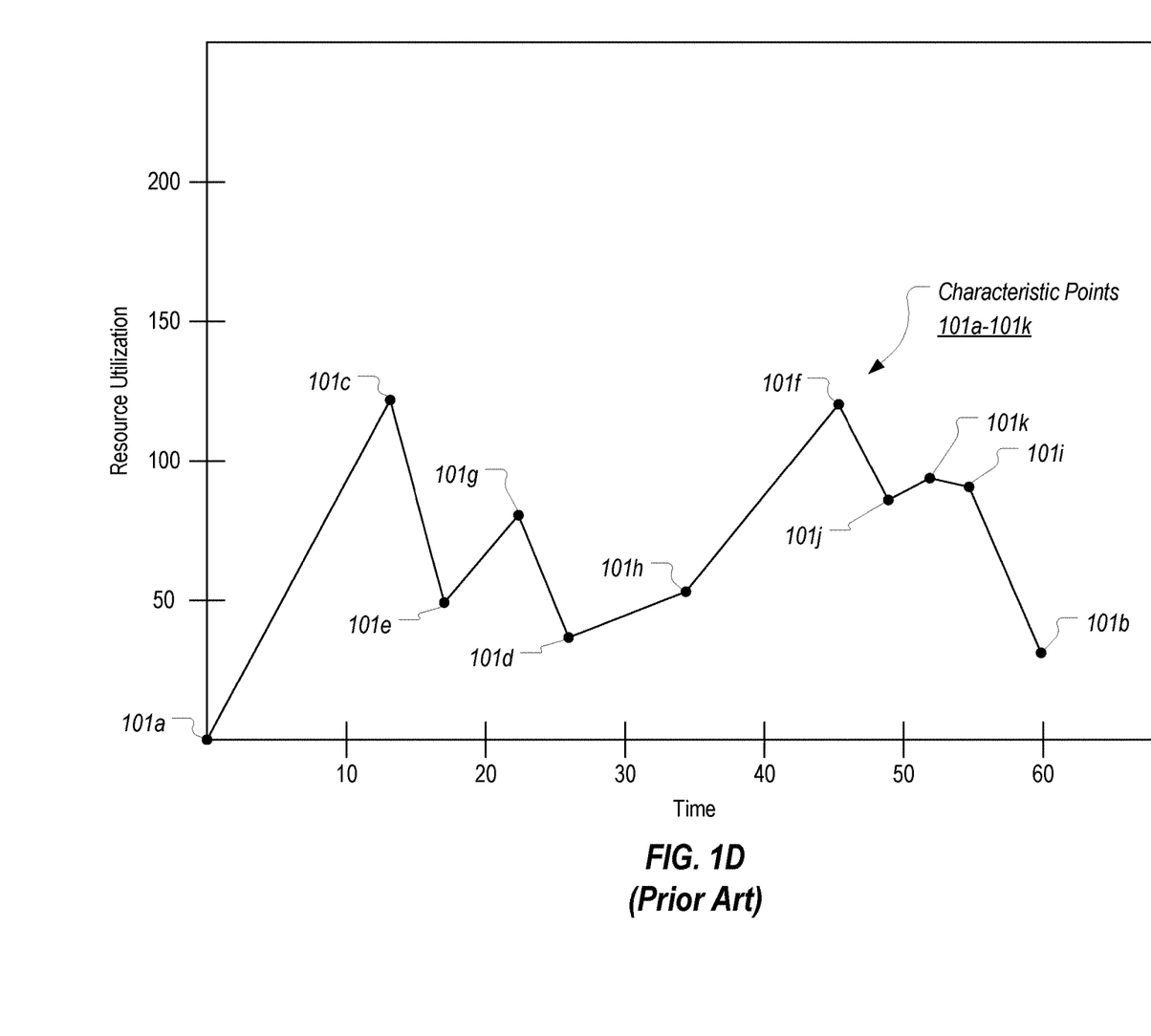

FIG. 1C then illustrates that the recursive process proceeds by defining line segments 102d and 102e which leads to characteristic points 101e and 101f being retained. Finally, FIG. 1D represents the set of characteristic points 101a-101k that will ultimately be defined after the process completes. In this example, it is assumed that the application of the Ramer-Douglas-Peucker algorithm has reduced the number of points in existing data 101 into eleven characteristic points 101a-101k. It is again noted that the number of characteristic points that will be generated is dependent on the value of $\varepsilon$. A lower value of $\varepsilon$ should typically produce a greater number of characteristic points. Although other line simplification algorithms are slightly different, they each employ a parameter similar to $\varepsilon$ when determining whether to retain a point as a characteristic point.

In accordance with embodiments of the present invention, once existing data 101 has been reduced to a set of characteristic points, a reverse simplification algorithm can be applied to the set of characteristic points to produce a new set of data. As will be described below, because the new set of data is generated from the set of characteristic points, the new set of data will have the same general curve or pattern as existing data 101 but will exhibit a degree of individual distinction. Therefore, the reverse simplification algorithm can be applied to existing data to produce simulation data that is substantially similar to the existing data but varies slightly in a manner that will represent resource utilization variations that may actually occur. Accordingly, the present invention can facilitate the production of simulation data that may more closely approximate real-world conditions.

Figure 2:
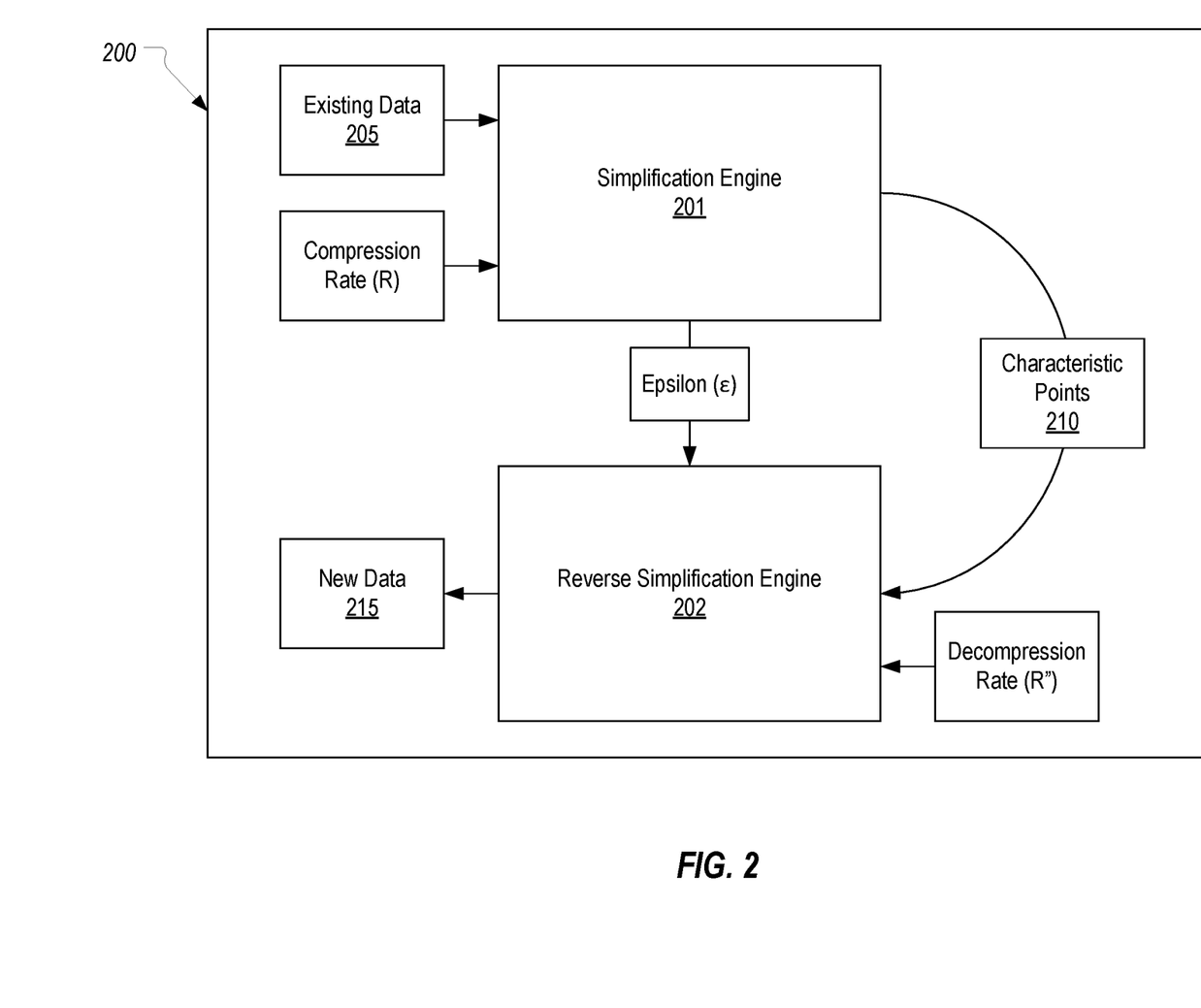
FIG. 2 illustrates an example computing system in accordance with some embodiments of the present invention.

FIG. 2 illustrates a computing environment in which the present invention can be implemented. As shown, a computing system 200 can include a simplification engine 201 and a reverse simplification engine 202. Simplification engine 201 can implement a simplification algorithm, such as the Ramer-Douglas-Peucker algorithm, to generate characteristic points 210 from a set of existing data 205 (e.g., existing data 101 from FIG. 1A). In accordance with embodiments of the present invention, in addition to receiving existing data 205 as an input, simplification engine 201 can also receive a compression rate, R, as an input. Compression rate R represents the extent to which the number of points in existing data 205 should be reduced. For example, if existing data 205 includes 1,000 points and the value of R is 10, simplification engine 201 can cause characteristic points 210 to include 100 points (i.e., reduce the number of points by a factor of 10).

Simplification engine 201 can be configured to employ the value of R to generate a value of $\varepsilon$ that will result in the appropriate number of characteristic points. For example, simplification engine 201 can iteratively apply the simplification algorithm on existing data 205 until the number of characteristic points that are produced matches the desired compression rate. Accordingly, simplification engine 201 can dynamically select a value for $\varepsilon$ as part of the process of producing characteristic points 210.

Once simplification engine 201 has generated characteristic points 210 that match the specified compression rate, this set of characteristic points and the value of $\varepsilon$ can be provided as inputs to reverse simplification engine 202. Reverse simplification engine 202 can implement a reverse simplification algorithm on characteristic points 210 using the value of $\varepsilon$ to generate a set of new data 215. As indicated above, new data 215 will resemble existing data 205 but will exhibit a degree of individual distinction.

FIGS. 3A-3F illustrate an example of how reverse simplification engine 202 can generate a set of new data 350 from characteristic points 101a-101k. In essence, reverse simplification engine 202 applies a reverse simplification algorithm to generate a number of points that in addition to the characteristic points which will make up the set of new data. The resulting set of new data will therefore have the same general pattern as the characteristic points (and therefore the existing data set) but with additional variations.

Figure 3A:
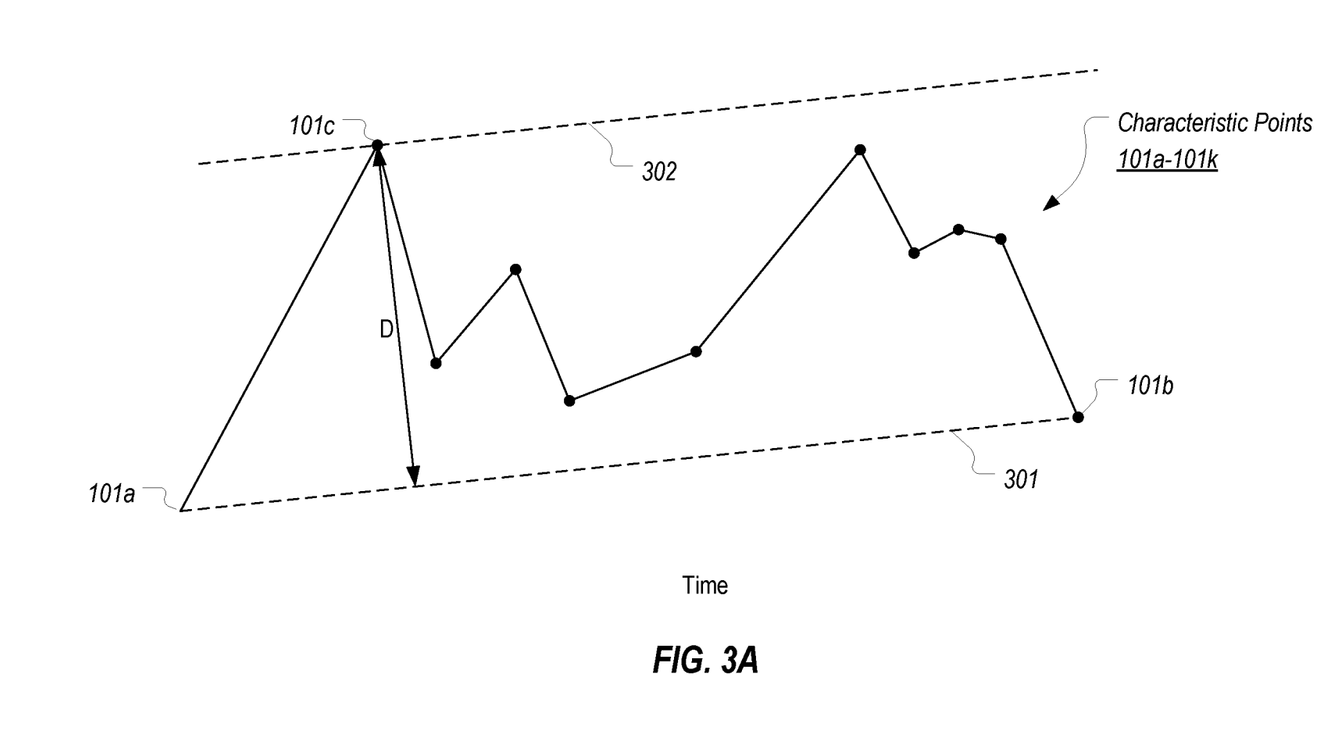
FIGS. 3A-3F illustrate an example of how a reverse simplification engine can perform a reverse simplification algorithm to generate a set of new data from characteristic points that were generated from existing data.

As shown in FIG. 3A, in some embodiment the first step of the reverse simplification algorithm is substantially similar to the first step of the Ramer-Douglas-Peucker algorithm, namely, a point having a perpendicular distance, D, that is the farthest from the line segment 301 between the first characteristic point 101a and the last characteristic point 101b is identified. In this case, the identified point will be characteristic point 101c since it is farther from line segment 301 than any other characteristic point.

The reason for identifying the farthest point from line segment 301 is that this farthest point serves as an intercept for a parallel line 302 that will serve as the upper bounds of each reverse simplification data sample zone that will be subsequently generated. In other words, parallel line 302 is the line segment that is parallel to line segment 301 and is the farthest-spaced parallel line that still intersects a characteristic point.

Figure 3B:
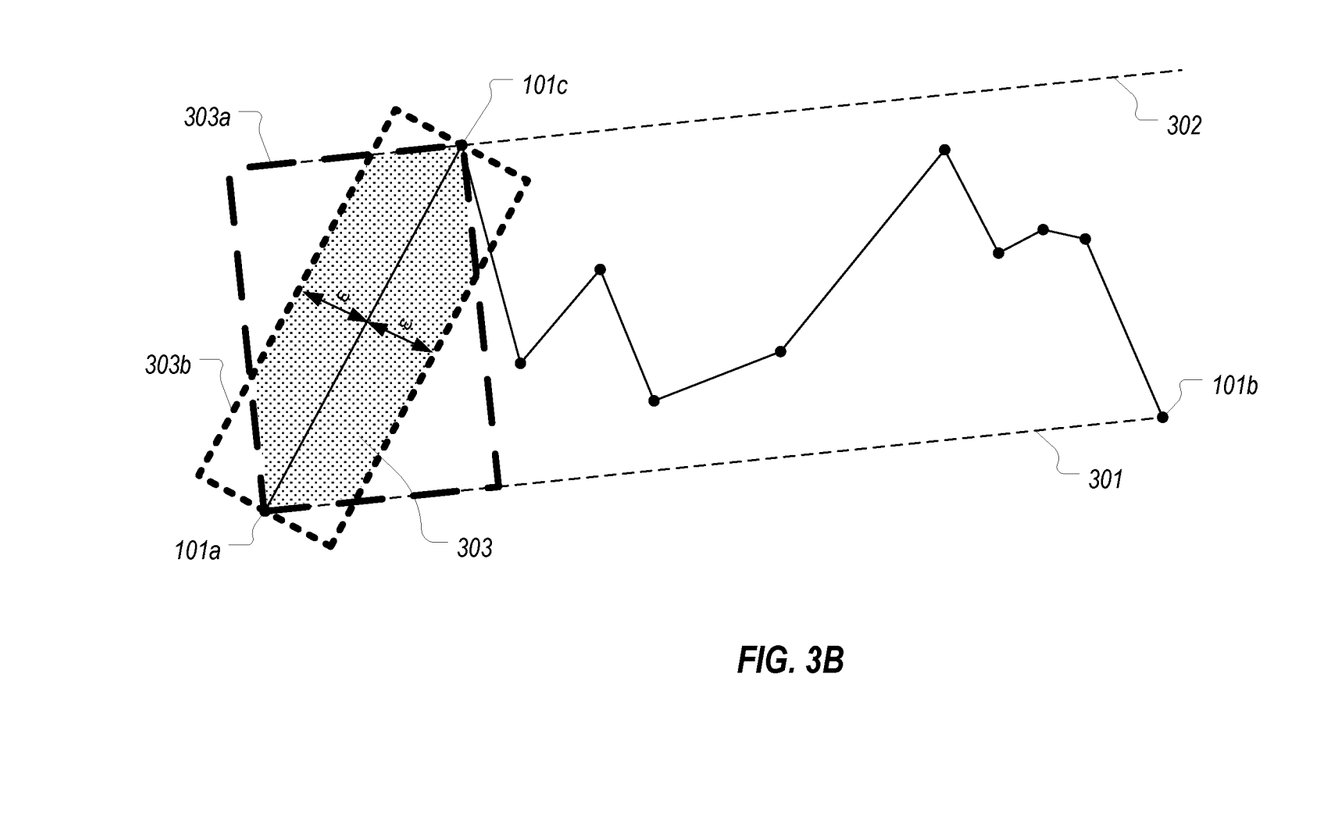

With parallel line 302 identified, reverse simplification engine 202 can then calculate a reverse simplification data sample zone for the line segment between each adjacent pair of characteristic points. For example, FIG. 3B illustrates how a reverse simplification data sample zone 303 (represented with the dotted pattern) can be generated for the line segment between characteristic points 101a and 101c. Reverse simplification data sample zone 303 can be defined as the intersection of two separate rectangles 303a, 303b. Rectangle 303a is defined as the rectangle that has a first set of opposing sides that extend along line segment 301 and parallel line 302 and a second set of opposing sides that intersect the subject characteristic points, which in this case are characteristic points 101a, 101c. Rectangle 303b is defined as the rectangle that has a first set of opposing sides that intersect the subject characteristic points, has an axis of symmetry along the line segment between the subject characteristic points, and that has a second set of opposing sides that are each spaced from the axis of symmetry by the value of ε that was received from simplification engine 201. As indicated above, many simplification algorithms, other than the Ramer-Douglas-Peucker algorithm employ a parameter similar to ε which affects how many characteristic points will be generated by the algorithm. Simplification engine 201 can provide the value of this corresponding parameter regardless of which simplification algorithm is employed.

Once reverse simplification data sample zone 303 has been defined, reverse simplification engine 202 can then generate a number of additional points within this zone. In some embodiments, the number of additional points that are generated per reverse simplification data sample zone can be based on an input decompression rate, R'. In some embodiments, the value of R' can be based on the value of the compression rate R. For example, the value of R' can be specified to cause the number of points in new data 215 to be substantially the same as, or a specified percentage of, the number of points in existing data 205. In other embodiments, the number of additional points can be based on a predefined parameter that does not require the separate input of a decompression rate. In any case, reverse simplification engine 202 can be configured to produce additional points between the subject characteristic points.

Reverse simplification engine 202 can generate these additional points in any suitable manner. For example, in some embodiments, an algorithm for randomly generating values within the reverse simplification data sample zone can be employed. In other embodiments, a semi-random or even a deterministic algorithm that employs the subject characteristic points or other known parameters can be employed. Accordingly, the present invention should not be limited to any particular manner in which the additional points are generated within any reverse simplification data sample zone.

Figure 3C:
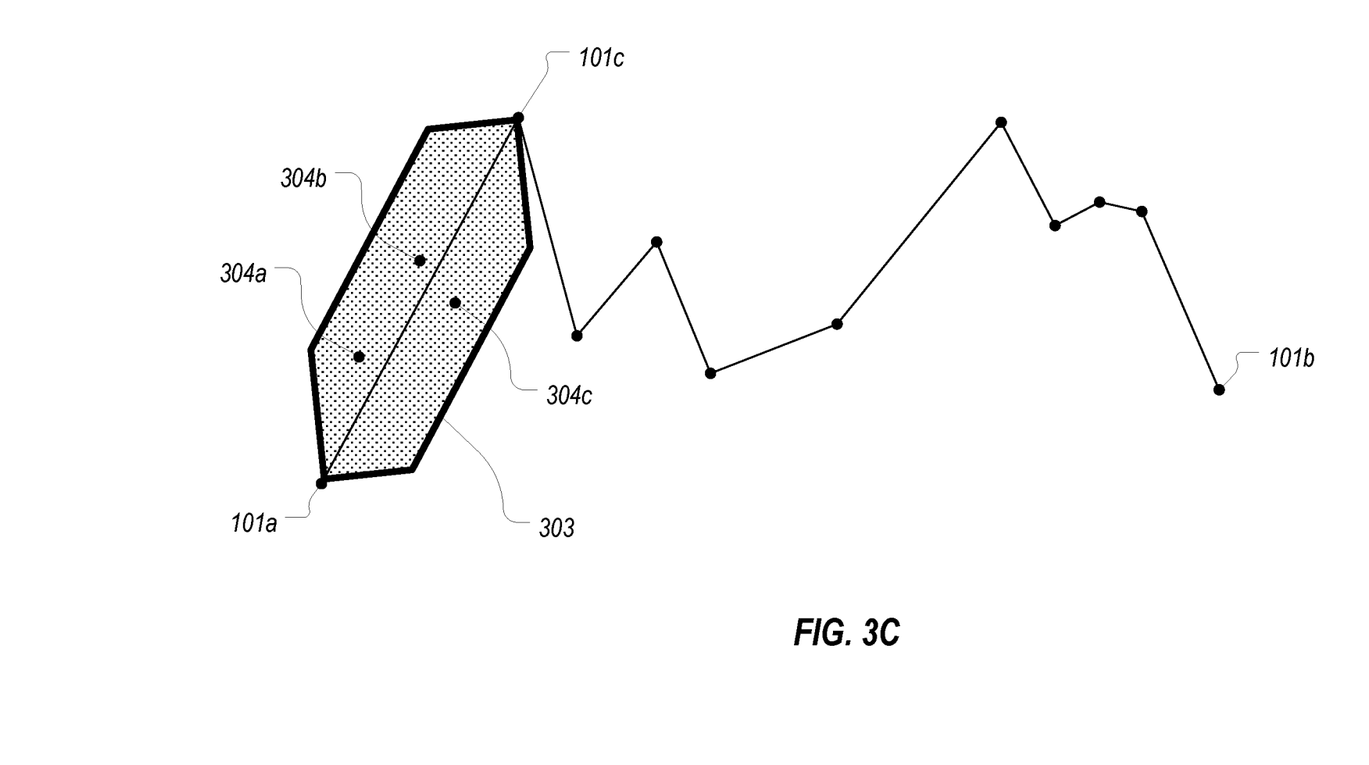
Figure 3D:
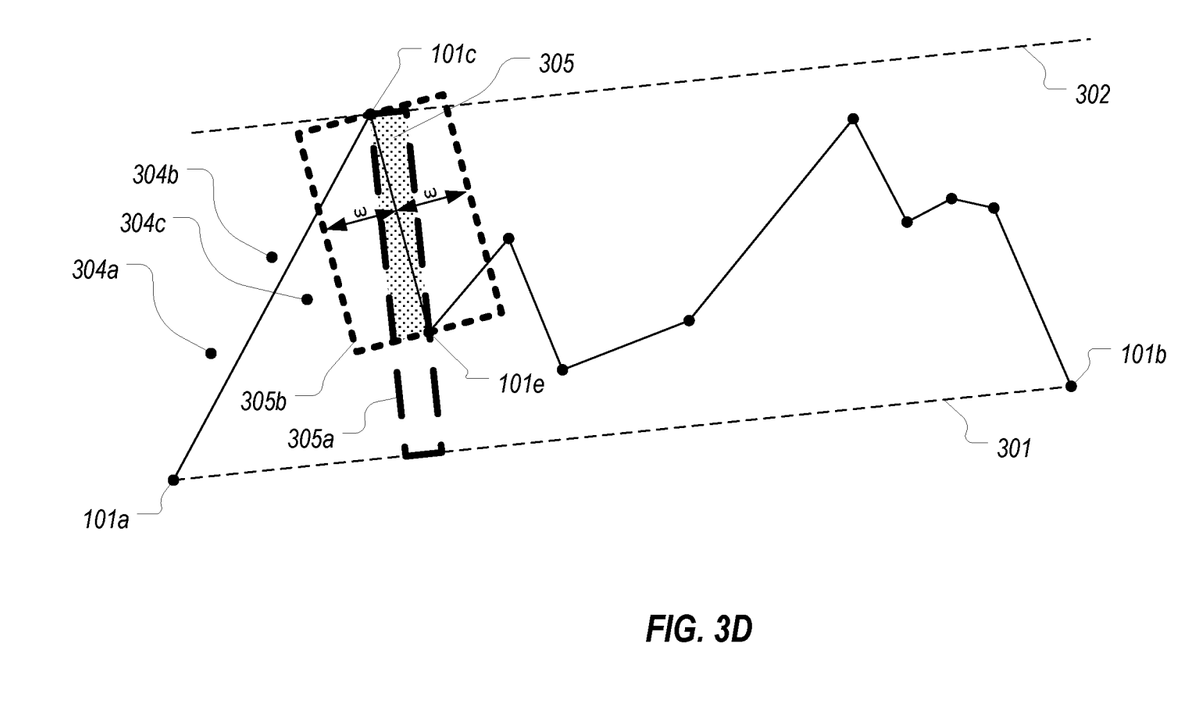
Figure 3E:
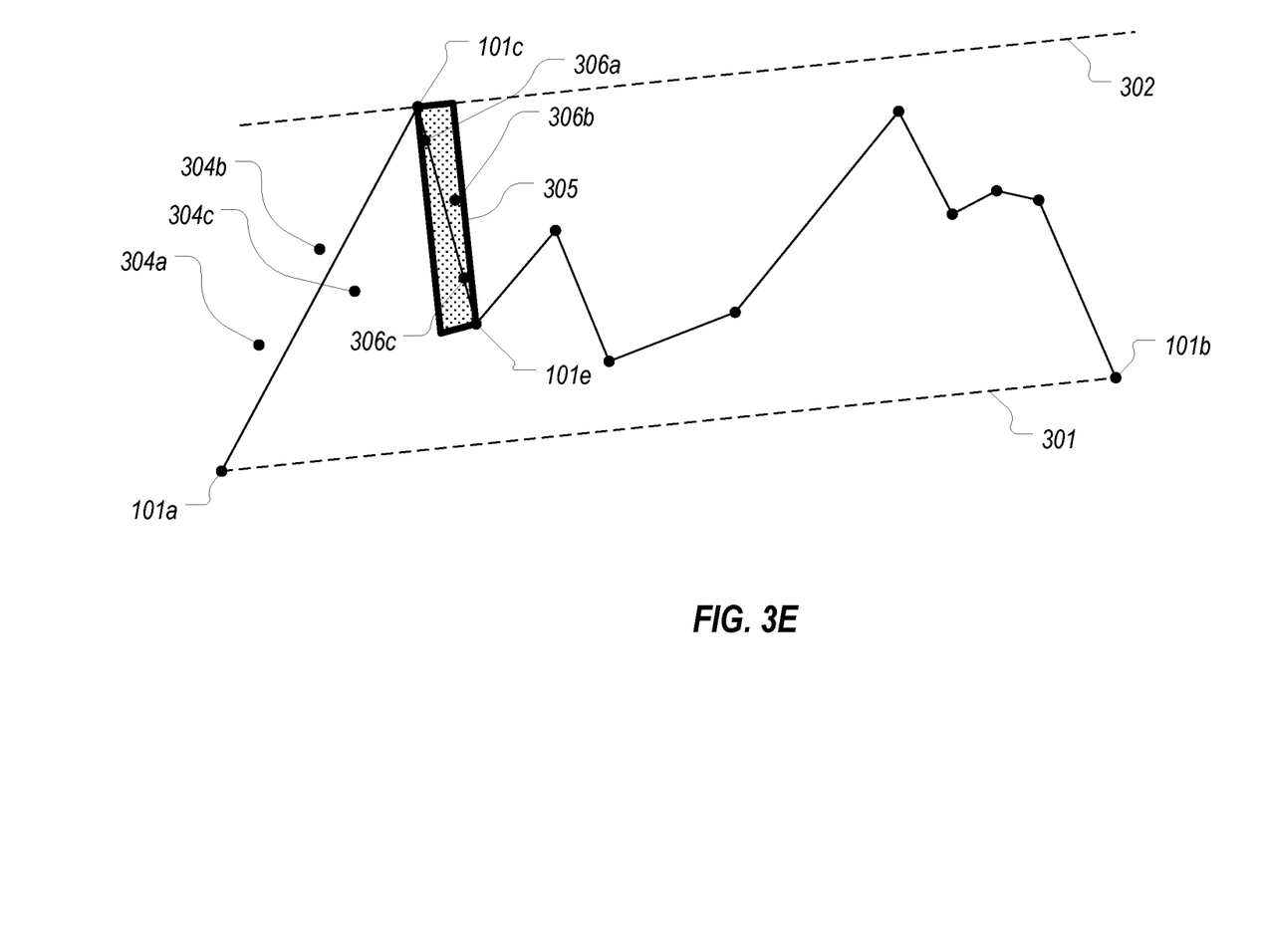

In FIG. 3C, it is assumed that reverse simplification engine 202 has randomly generated three additional points 304a, 304b, and 304c within reverse simplification data sample zone 303. At this point, reverse simplification engine 202 can move onto another adjacent set of characteristic points and repeat the process. For example, FIG. 3D illustrates how reverse simplification engine 202 can generate a reverse simplification data sample zone 305 for the line segment between characteristic points 101c, 101e. In a similar manner as described above, reverse simplification data sample zone 305 can be defined as the intersection of rectangles 305a, 305b. Rectangles 305a, 305b can be defined in the manner described above for rectangles 303a, 303b except that characteristic points 101c, 101e can be used.

Figure 3F:
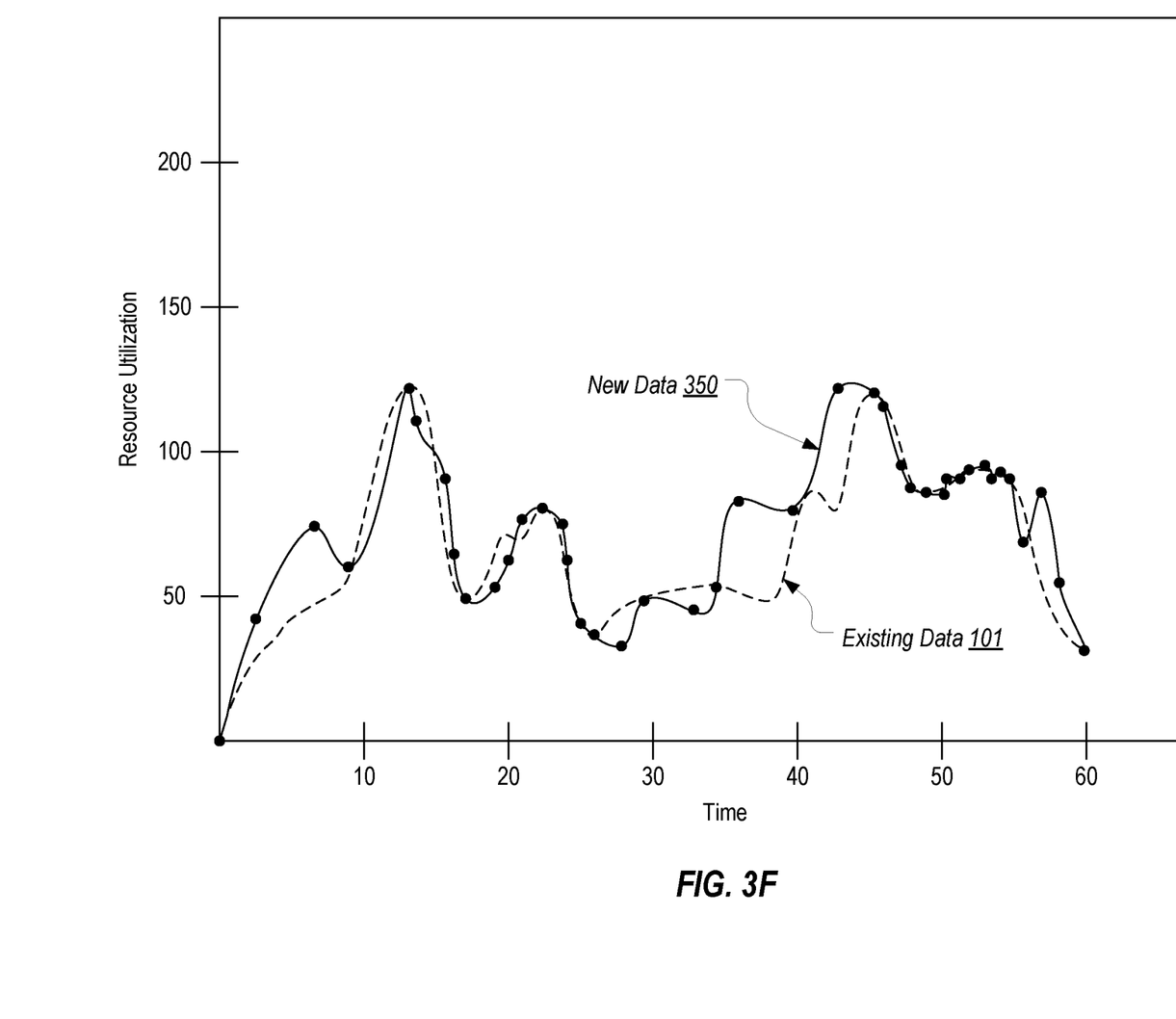

With reverse simplification data sample zone 305 defined, reverse simplification engine 202 can generate additional points for the zone. As shown in FIG. 3E, it is again assumed that three additional points 306a, 306b, and 306c are generated. This same process can be repeated for the remaining sets of adjacent characteristic points to define a reverse simplification data sample zone for each set and to generate additional points within each zone. At the end of this process, reverse simplification engine 202 will have generated a number of additional points that in combination with characteristic points 101a-101k will produce a pattern that varies slightly from the pattern of existing data 101. For example, FIG. 3F illustrates how new data 350 can have the same general pattern as existing data 101 but with slight variations.

Once new data 350 is generated, it can be employed as simulation or test data in a system for which existing data 101 was generated. For example, if existing data 101 represents CPU load of a system during working hours, new data 350 could be employed as simulation data to test the system or a similar system with a slightly different CPU load profile.

In some embodiments, the present invention may also include functionality for validating new data produced by reverse simplification engine 202. This validation can be performed by inputting the new data to simplification engine 201 to generate characteristic points for the new data. If the characteristic points generated from the new data match the characteristic points from which the new data was generated, the new data can be validated. In this way, it can be ensured that the new data retains the same general pattern as exhibited in the existing data.

In summary, the present invention can facilitate the generation of simulation data. The simulation data can be generated with a degree of distinction from existing data to facilitate testing or simulating variable environments/scenarios. The degree of distinction that the generated simulation data will exhibit is controllable by providing a compression rate input to the simplification engine. This degree of distinction may also be additionally controllable by providing a decompression rate input to the reverse simplification engine.

The present invention can also provide the benefit of minimizing the amount of data that must be stored and/or transmitted. Because simulation data can be generated from characteristic points, the existing data from which the characteristic points are generated need not be stored. Also, in embodiments where reverse simplification engine 202 may be located remotely from simplification engine 201 (e.g., when a server may implement simplification engine 201 and a client may implement reverse simplification engine 202), only characteristic points 210 and the value of ε will need to be transmitted to reverse simplification engine 202 to allow reverse simplification engine 202 to generate simulation data. Such may be the case when a company acts as a source of simulation data for a number of customers. The company can simply provide a suitable set of characteristic points to a customer and allow the customer to implement reverse simplification engine 202 locally to generate simulation data.

Figure 4:
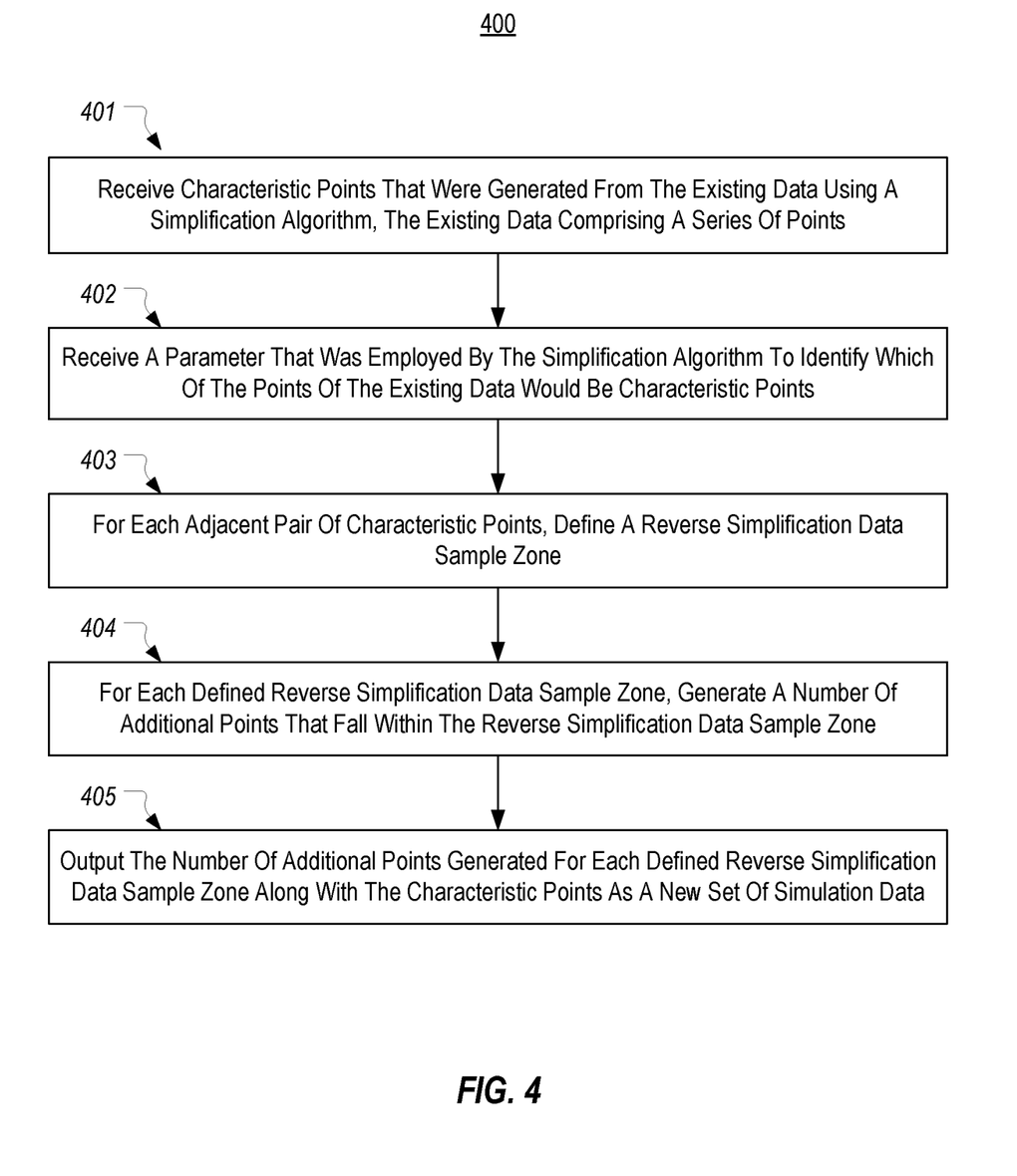
FIG. 4 illustrates a flowchart of an example method for generating simulation data based on existing data.

FIG. 4 illustrates a flowchart of an example method for generating simulation data based on existing data. Method 400 can be implemented by reverse simplification engine 202 and will be described with reference to the examples shown in FIGS. 1-3F.

Method 400 includes an act 401 of receiving characteristic points that were generated from the existing data using a simplification algorithm, the existing data comprising a series of points. For example, reverse simplification engine 202 can receive characteristic points 101a-101k that were generated from existing data 101.

Method 400 includes an act 402 of receiving a parameter that was employed by the simplification algorithm to identify which of the points of the existing data would be characteristic points. For example, reverse simplification engine 202 can receive a value of that was employed to generate characteristic points 101a-101k. Similarly, reverse simplification engine 202 could receive another parameter when a different simplification algorithm is employed.

Method 400 includes an act 403 of, for each adjacent pair of characteristic points, defining a reverse simplification data sample zone. For example, reverse simplification engine 202 can define reverse simplification data sample zone 303 for characteristic points 101a, 101c.

Method 400 includes an act 404 of, for each defined reverse simplification data sample zone, generating a number of additional points that fall within the reverse simplification data sample zone. For example, reverse simplification engine 202 can generate points 304a-304c within reverse simplification data sample zone 303.

Method 400 includes an act 405 of outputting the number of additional points generated for each defined reverse simplification data sample zone along with the characteristic points as a new set of simulation data. For example, reverse simplification engine 202 can output new data 350.

Embodiments of the present invention may comprise or utilize special purpose or general-purpose computers including computer hardware, such as, for example, one or more processors and system memory. Embodiments within the scope of the present invention also include physical and other computer-readable media for carrying or storing computer-executable instructions and/or data structures. Such computer-readable media can be any available media that can be accessed by a general purpose or special purpose computer system.

Computer-readable media is categorized into two disjoint categories: computer storage media and transmission media. Computer storage media (devices) include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other similarly storage medium which can be used to store desired program code means in the form of computer-executable instructions or data structures and which can be accessed by a general purpose or special purpose computer. Transmission media include signals and carrier waves.

Computer-executable instructions comprise, for example, instructions and data which, when executed by a processor, cause a general purpose computer, special purpose computer, or special purpose processing device to perform a certain function or group of functions. The computer executable instructions may be, for example, binaries, intermediate format instructions such as assembly language or P-Code, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like.

The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices. An example of a distributed system environment is a cloud of networked servers or server resources. Accordingly, the present invention can be hosted in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A method, performed by a computing system that includes a simplification engine and a reverse simplification engine, for generating simulation data for testing a subject computing system based on existing data for the subject computing system by applying a simplification algorithm and a reverse simplification algorithm to the existing data to generate the simulation data with a controllable degree of individual distinction from the existing data such that the simulation data represents resource utilization variations that may actually occur when the subject computing system is executing, the method comprising:

obtaining, by the simplification engine, the existing data that comprises a series of points where each point represents resource utilization of the subject computing system at a particular time;

applying, by the simplification engine, the simplification algorithm to the existing data to convert the existing data into a reduced set of characteristic points, wherein the simplification engine employs a particular value of a parameter to calculate which of the points of the existing data are characteristic points;

receiving, by the reverse simplification engine and from the simplification engine, the reduced set of characteristic points and the particular value of the parameter;

calculating, by the reverse simplification engine, simulation data with a degree of individual distinction from the existing data by:

for each adjacent pair of characteristic points, defining a reverse simplification data sample zone using the particular value of the parameter;

for each defined reverse simplification data sample zone, generating a number of additional points that fall within the reverse simplification data sample zone; and combining the number of additional points generated for each defined reverse simplification data sample zone along with the characteristic points to thereby produce the simulation data; and testing the subject computing system using the simulation data.

2. The method of claim 1, wherein each point in the series of points of the existing data represents one of:

actual resource utilization of the subject computing system obtained by monitoring the actual computing system's performance at each particular time; or simulated resource utilization.

3. The method of claim 1, wherein the parameter comprises a distance.

4. The method of claim 3, wherein the distance is a perpendicular distance from a line between two points of the existing data.

5. The method of claim 4, wherein the two points of the existing data are the first and last points.

6. The method of claim 3, wherein the distance is a radial distance.

7. The method of claim 1, wherein defining a reverse simplification data sample zone comprises:
identifying a first line between a first and a last characteristic point; and
identifying a second line that is parallel to the first line and is the farthest-spaced line from the first line that intersects a characteristic point.

8. The method of claim 7, wherein defining a reverse simplification data sample zone further comprises:
identifying a first rectangle that has a first set of opposing sides that extend along the first and second lines and a second set of opposing sides that intersect the adjacent pair of characteristic points; and
identifying a second rectangle that has a first set of opposing sides that intersect the adjacent pair of characteristic points, has an axis of symmetry along a line segment between the adjacent pair of characteristic points, and that has a second set of opposing sides that are each spaced from the axis of symmetry by the particular value of the parameter;
wherein the reverse simplification data sample zone comprises the intersection of the first and second rectangles.

9. The method of claim 1, wherein the number of additional points are generated randomly.

10. The method of claim 1, further comprising:
receiving, by the reverse simplification engine, a decompression rate, wherein the number of additional points that are generated are based on the decompression rate.

11. The method of claim 1, wherein the number of additional points that are generated are based on a number of points in the existing data.

12. The method of claim 1, further comprising:
generating characteristic points from the simulation data; and
comparing the characteristic points generated from the simulation data to the characteristic points that were generated from the existing data to verify that the simulation data exhibits a degree of individual distinction from the existing data.

13. The method of claim 1, wherein the simplification algorithm is the Ramer-Douglas-Peucker algorithm.

14. The method of claim 1, further comprising:
applying, by the simplification engine, the simplification algorithm to the existing data to convert the existing data into a second reduced set of characteristic points, wherein the simplification engine employs a second particular value of the parameter, different from the first particular value of the parameter, to calculate which of the points of the existing data are characteristic points in the second reduced set of characteristic points;
receiving, by the reverse simplification engine and from the simplification engine, the second reduced set of characteristic points and the second particular value of the parameter;
calculating, by the reverse simplification engine, second simulation data with a second degree of individual distinction from the existing data by:
for each adjacent pair of characteristic points in the second reduced set of characteristic points, defining a reverse simplification data sample zone using the second particular value of the parameter;
for each defined reverse simplification data sample zone, generating a number of additional points that fall within the reverse simplification data sample zone; and
combining the number of additional points generated for each defined reverse simplification data sample zone along with the characteristic points in the second reduced set of characteristic points to thereby produce the second simulation data; and
testing the subject computing system using the second simulation data.

15. The method of claim 1, further comprising:
sending the characteristic points and the particular value of the parameter to another reverse simplification engine.

16. One or more computer storage media storing computer executable instructions which when executed by one or more processors implement a method for generating simulation data for testing a subject computing system based on existing data for the subject computing system by applying a simplification algorithm and a reverse simplification algorithm to the existing data to generate the simulation data with a controllable degree of individual distinction from the existing data such that the simulation data represents resource utilization variations that may actually occur when the subject computing system is executing, the method comprising:
obtaining, by a simplification engine, the existing data that comprises a series of points where each point represents resource utilization of the subject computing system at a particular time;
applying, by the simplification engine, the simplification algorithm to the existing data to convert the existing data into a reduced set of characteristic points, wherein the simplification engine employs a particular value of a parameter to calculate which of the points of the existing data are characteristic points;
receiving, by a reverse simplification engine and from the simplification engine, the reduced set of characteristic points and the particular value of the parameter;
calculating, by the reverse simplification engine, simulation data with a degree of individual distinction from the existing data by:
for each adjacent pair of characteristic points, defining a reverse simplification data sample zone using the particular value of the parameter;
for each defined reverse simplification data sample zone, generating a number of additional points that fall within the reverse simplification data sample zone; and
combining the number of additional points generated for each defined reverse simplification data sample zone along with the characteristic points to thereby produce the simulation data; and
testing the subject computing system using the simulation data.

17. The computer storage media of claim 16, wherein defining a reverse simplification data sample zone comprises:
identifying a first line between a first and a last characteristic point; and identifying a second line that is parallel to the first line and is the farthest-spaced line from the first line that intersects a characteristic point.

18. The computer storage media of claim 17, wherein defining a reverse simplification data sample zone further comprises:
   identifying a first rectangle that has a first set of opposing sides that extend along the first and second lines and a second set of opposing sides that intersect the adjacent pair of characteristic points; and
   identifying a second rectangle that has a first set of opposing sides that intersect the adjacent pair of characteristic points, has an axis of symmetry along a line segment between the adjacent pair of characteristic points, and that has a second set of opposing sides that are each spaced from the axis of symmetry by the particular value of the parameter;
   wherein the reverse simplification data sample zone comprises the intersection of the first and second rectangles.

19. A method, performed by a computing system that includes a simplification engine and a reverse simplification engine, for generating multiple sets of simulation data for testing a subject computing system based on existing data for the subject computing system by applying a simplification algorithm and a reverse simplification algorithm to the existing data to generate each of the multiple sets of simulation data with a controllable degree of individual distinction from the existing data such that each of the multiple sets of simulation data represents resource utilization variations that may actually occur when the subject computing system is executing, the method comprising:
   obtaining, by the simplification engine, the existing data that comprises a series of points where each point represents resource utilization of the subject computing system at a particular time;
   applying, by the simplification engine, the simplification algorithm to the existing data to convert the existing data into multiple reduced sets of characteristic points, wherein the simplification engine employs a different value of a parameter to calculate which of the points of the existing data are characteristic points in each of the multiple reduced sets of the characteristic points;
   receiving, by the reverse simplification engine and from the simplification engine, the multiple reduced sets of characteristic points and the corresponding values of the parameter;
   calculating, by the reverse simplification engine, multiple sets of simulation data where each set of simulation data exhibits a different degree of individual distinction from the existing data, each set of simulation data being calculated using a corresponding reduced set of characteristic points and a corresponding value of the parameter by:
      for each adjacent pair of characteristic points in the corresponding reduced set of characteristic points, defining a reverse simplification data sample zone using the corresponding value of the parameter;
      for each defined reverse simplification data sample zone, generating a number of additional points that fall within the reverse simplification data sample zone; and
      combining the number of additional points generated for each defined reverse simplification data sample zone along with the characteristic points in the corresponding reduced set of characteristic points to thereby produce the set of simulation data; and
   testing the subject computing system using at least one of the sets of simulation data.

20. The method of claim 19, wherein defining a reverse simplification data sample zone comprises:
   identifying a first line between a first and a last characteristic point in the corresponding reduced set of characteristic points;
   identifying a second line that is parallel to the first line and is the farthest-spaced line from the first line that intersects a characteristic point;
   identifying a first rectangle that has a first set of opposing sides that extend along the first and second lines and a second set of opposing sides that intersect the adjacent pair of characteristic points; and
   identifying a second rectangle that has a first set of opposing sides that intersect the adjacent pair of characteristic points, has an axis of symmetry along a line segment between the adjacent pair of characteristic points, and that has a second set of opposing sides that are each spaced from the axis of symmetry by the corresponding value of the parameter;
   wherein the reverse simplification data sample zone comprises the intersection of the first and second rectangles.

* * * * *